(12) United States Patent
Liu et al.

(10) Patent No.: US 11,166,098 B2
(45) Date of Patent: Nov. 2, 2021

(54) ACOUSTIC INPUT DEVICES COMPRISING ACOUSTIC PORTS AND TRANSDUCERS

(71) Applicant: HEWLETT-PACKARD DEVELOPMENT COMPANY, L.P., Houston, TX (US)

(72) Inventors: Wensen Liu, San Diego, CA (US); HyunWoo Choi, San Diego, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 667 days.

(21) Appl. No.: 16/075,622

(22) PCT Filed: Jan. 20, 2017

(86) PCT No.: PCT/US2017/014318
§ 371 (c)(1),
(2) Date: Aug. 4, 2018

(87) PCT Pub. No.: WO2018/136079
PCT Pub. Date: Jul. 26, 2018

(65) Prior Publication Data
US 2021/0195322 A1 Jun. 24, 2021

(51) Int. Cl.
*H04R 3/00* (2006.01)
*H04R 1/00* (2006.01)
(Continued)

(52) U.S. Cl.
CPC .............. *H04R 3/005* (2013.01); *H04R 1/005* (2013.01); *H04R 1/04* (2013.01); *H04R 1/406* (2013.01);
(Continued)

(58) Field of Classification Search
CPC ............ H04R 2400/03; H04R 2460/03; H04R 25/505; H04R 25/609; H04R 29/004;
(Continued)

(56) References Cited

U.S. PATENT DOCUMENTS 6,597,793 B1 7/2003 Darbut et al.
6,681,021 B1 1/2004 Saltykov
(Continued)

FOREIGN PATENT DOCUMENTS

EP 2389770 B1 1/2016

OTHER PUBLICATIONS

"Acoustic Interface Design Guide", Knowles, Retrieved from Internet: http://www.mouser.com/pdfdocs/Knowles-Acoustic-Interface-Design-Guide.pdf, 2012, 40 pages.
(Continued)

*Primary Examiner* — Lun-See Lao
(74) *Attorney, Agent, or Firm* — Trop, Pruner & Hu P.C.

(57) ABSTRACT

In some examples, an acoustic input device includes a housing comprising a plurality of acoustic ports, and a plurality of single-port acoustic transducers within the housing to receive respective acoustic waves from an environment outside the acoustic input device through corresponding acoustic ports of the plurality of acoustic ports, where a first acoustic port of the plurality of acoustic ports is located on a first surface of the housing, and a second acoustic port of the plurality of acoustic ports is located on a second surface of the housing that is opposite the first surface. The acoustic input device further includes a controller within the housing to receive outputs of the plurality of acoustic transducers.

20 Claims, 4 Drawing Sheets

(51) Int. Cl.
  *H04R 1/04* (2006.01)
  *H04R 1/40* (2006.01)
  *H04R 19/04* (2006.01)
(52) U.S. Cl.
  CPC ...... *B81B 2201/0257* (2013.01); *H04R 19/04* (2013.01); *H04R 2201/003* (2013.01)
(58) Field of Classification Search
  CPC ........... H04R 3/04; G10L 25/78; G10L 15/22; G10L 2015/223; G10L 15/30; G10L 25/48; G10L 2015/228; G10L 15/00; G10L 2021/02161; G10L 15/24; G10L 15/32; G10L 15/005; G10L 15/02; G10L 15/08; G10L 19/00; G10L 2015/025; G10L 2015/088; G10L 21/0208; G10L 25/18; G10L 25/21; G10L 25/24; G10L 25/51; H04B 11/00; H04B 7/0617; H04B 17/102; H04B 17/13; H04B 1/04; H04B 1/3827; H04B 1/3838; H04B 2001/0408; H04L 63/0876; H04L 67/12; H04L 27/2657; H04L 27/2697; H04L 27/2698; H04L 5/0046; H04L 7/0008; H04L 7/0012; H04L 7/0033; H04L 29/06; H04L 63/0853; H04L 63/0861; H04L 67/10; H04W 12/06; H04W 12/08; H04W 12/71; H04W 52/367; H04W 64/003; H04W 12/02; H04W 12/033; H04W 40/22; H04W 4/02; H04W 4/70; H04W 4/80; H04W 4/90; G10K 11/17823; G10K 11/17853; G10K 11/17855; G10K 11/17857; G10K 11/17881; G10K 11/17883; G10K 2210/1282; G10K 2210/3053; G10K 11/175; G10K 11/346; H03G 3/32; H03G 5/00; H03G 5/025; H04M 1/03; H04M 1/605; H04N 21/41422; H04N 21/42202; H04N 21/42218; H04N 21/45; H04N 5/232; H04N 5/3765
  USPC .............................. 381/111, 355, 369, 361
  See application file for complete search history.

(56) References Cited

U.S. PATENT DOCUMENTS

| | | |
|---|---|---|
| 8,804,982 B2 | 8/2014 | Michel et al. |
| 9,067,780 B1 | 6/2015 | Minervini |
| 9,380,377 B2 | 6/2016 | Jingming |
| 9,432,759 B2 * | 8/2016 | Elian ..................... B81B 7/0061 |
| 2003/0004729 A1 | 1/2003 | Allen et al. |
| 2010/0303274 A1* | 12/2010 | Ryan ...................... H04R 1/222 381/361 |
| 2015/0023523 A1 | 1/2015 | Elian et al. |
| 2015/0237432 A1 | 8/2015 | Miluzzi et al. |
| 2015/0350772 A1* | 12/2015 | Oliaei ...................... H04R 1/04 381/111 |
| 2016/0150337 A1 | 5/2016 | Nandy |
| 2016/0167946 A1 | 6/2016 | Jenkins et al. |
| 2016/0205463 A1 | 7/2016 | Szczech et al. |
| 2017/0261647 A1* | 9/2017 | Wolf ....................... G01L 1/165 |

OTHER PUBLICATIONS

Morcelli, "Basic principles of MEMS microphones", EDN Network, Retrieved from Internet: https://www.edn.com/design/analog/4430264/Basic-principles-of-MEMS-microphones-, May 14, 2014, 9 pages.

Thompson, "Directional Microphone Patterns: They Also Have Disadvantages", Audiology Online, Retrieved from Internet: http://www.audiologyonline.com/articles/directional-microphone-patterns-they-also-1294, Aug. 21, 2000, 4 pages.

* cited by examiner

ACOUSTIC INPUT DEVICES COMPRISING ACOUSTIC PORTS AND TRANSDUCERS

BACKGROUND

A microphone can be used to convert sound waves into other forms of signal that can be processed and stored. Generally, a microphone can convert air pressure variations of a sound wave to an electrical signal. The electrical signal can be provided to an electronic device for further processing, transmission, or saving in a storage medium.

BRIEF DESCRIPTION OF THE DRAWINGS

Some implementations of the present disclosure are described with respect to the following figures.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

A microphone converts acoustic waves into signals that can be processed by users. Some microphones are digital microphones, which can convert sound waves into digital data that can be provided to processing circuitry to produce corresponding outputs. For example, the processing circuitry can include an audio coder/decoder (codec) or another type of processing circuitry. A digital microphone includes a controller that receives analog outputs of an acoustic transducer (also referred to as an acoustic sensor) and produces corresponding digital data. For example, the controller can include a digitizer that is able to digitize the analog output of the acoustic transducer. The controller can include further circuitry to perform other processing tasks. Generally, an acoustic transducer (or equivalently an acoustic sensor) is a device that converts one form of energy (e.g., acoustic energy) into another form of energy (e.g., an electrical signal, an optical signal, etc.).

A digital microphone can have an acoustic inlet port (or more simply, an "acoustic port") through which sound waves can pass from an environment outside the digital microphone to a chamber within the digital microphone. The acoustic transducer in the digital microphone senses the acoustic wave, and produces a corresponding analog output that is provided to a controller inside the digital microphone.

A digital microphone can be included as part of an electronic device, such as a desktop computer, a notebook computer, a tablet computer, a smartphone, a game appliance, a wearable device (e.g., a smart watch, smart eyeglasses, a head-mounted device, etc.), a vehicle, and so forth. Some electronic devices can include multiple digital microphones. However, including multiple digital microphones in an electronic device, particularly an electronic device that is relatively small in size, can take up valuable physical space in the electronic device for accommodating electronic components of the digital microphones and signal lines and corresponding contact pads that connect the electronic components to other component(s). Moreover, the multiple digital microphones can include duplicate electronic components, such as controllers, which can increase the overall cost of the electronic device. Additionally, an increased number of signal lines that connect to multiple digital microphones can lead to increased interference caused by signals propagated over the signal lines.

Although reference is made to microphones, which convert acoustic waves into signals that can be processed into a form that is perceptible to a human user, techniques or mechanisms according to some implementations are applicable to other types of acoustic input devices. An acoustic input device refers generally to a device that is able to receive an acoustic input (in the form of acoustic waves) and produce an output that is useable for any of various purposes. The output produced by the acoustic input device can be used to generate sound that can be heard by a user. Alternatively, the output from the acoustic input device can be recorded by a recording device, can be used to trigger an action by another system (e.g., an alarm system for detecting unauthorized intrusion of a physical space), or for any other purpose.

Figure 1:
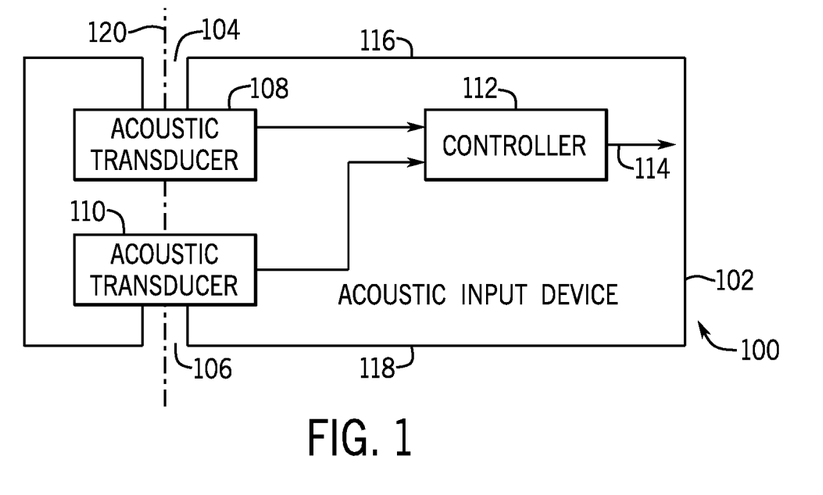
FIG. 1 is a block diagram of an acoustic input device according to some examples.

In accordance with some implementations of the present disclosure, as shown in FIG. 1, an acoustic input device 100 includes a housing 102, and multiple acoustic ports 104 and 106 formed in the housing 102. Acoustic waves from an environment outside the acoustic input device 100 can pass through the acoustic ports 104 and 106 into the acoustic input device 100. The acoustic waves are detected by corresponding multiple acoustic transducers 108 and 110 that are positioned near the respective acoustic ports 104 and 106. Although two acoustic ports 104 and 106 and two corresponding acoustic transducers 108 and 110 are shown in FIG. 1, it is noted that in other examples, more than two acoustic ports and corresponding acoustic transducers can be provided in the acoustic input device 100.

Each acoustic port 104 or 106 can include an aperture through which acoustic waves can travel. Alternatively, each acoustic port 104 or 106 can include a layer formed of a material that allows acoustic waves to propagate through the layer but prevent other substances such as water from entering into the port. For example, such a layer can provide protection for components within the acoustic input device 100.

The outputs from the acoustic transducers 108 and 110 (which can be analog outputs) are provided to inputs of a controller 112 in the acoustic input device 100. The controller 112 can apply specified processing on the outputs from the acoustic transducers 108 and 110. For example, the controller 112 can digitize the analog outputs from the acoustic transducers 108 and 110 to produce digital data. The controller 112 can perform other or additional tasks with respect to the outputs from the acoustic transducers 108 and 110.

Generally, the controller 112 can include a hardware processing circuit, which can be implemented as any one or some combination of the following: a microcontroller, a microprocessor, a core of a multi-core microprocessor, a programmable integrated circuit device, a programmable gate array, or any other type of hardware processing circuit.

A "controller" can refer to a single device (such as a single integrated circuit device) or to multiple devices.

The controller 112 produces an output 114 based on the processing applied on the outputs of the acoustic transducers 108 and 110. The output 114 can be connected to an electrical contact pad on the acoustic input device 100, where an external device can be connected to the electrical contact pad to receive the output of the controller 112. In other examples, the output 114 of the controller 112 can be directed to a component inside the acoustic input device 100, such as a storage component (e.g., a memory), or a different component.

In some examples, the acoustic transducers 108 and 110 can include microelectromechanical system (MEMS) transducers. A MEMS transducer can be fabricated as an electronic die that includes a substrate and various layers formed on the substrate. The layers can include a moveable membrane and a rigid back plate, where the moveable membrane flexes in response to a change in air pressure caused by sound waves. The movement of the membrane creates a change in an amount of capacitance between the membrane and the back plate, which causes a corresponding change in voltage output by the MEMS transducer, which can be detected by the controller 112. The MEMS acoustic transducers 108 and 110 are constructed such that their respective membranes only respond to the sound waves that enter into the ports 104 and 106, respectively. As a result, the sound waves entering into the ports 104 and 106 do not interfere each other acoustically.

In some examples, the acoustic port 104 is located at a first surface 116 of the acoustic input device 100, and the acoustic port 106 is located at a second surface 118 of the housing 102, where the second surface 118 is opposite to the first surface 116 on the housing 102. The surfaces 116 and 118 are opposite to each other in that they face toward the external environment of the acoustic input device 100 in opposite directions. In the orientation shown in FIG. 1, the first surface 116 is a top surface of the acoustic input device 100, while the second surface 118 is a bottom surface of the acoustic input device 100. In other orientations of the acoustic input device 100, the surfaces 116 and 118 can be on opposite sides of the acoustic input device 100.

As further shown in FIG. 1, in accordance with some examples, the acoustic ports 104 and 106 are laterally aligned with respect to each other along an axis 120 that passes through the acoustic ports 104 and 106. In the orientation shown in FIG. 1, the axis 120 is a vertical axis, such that the acoustic ports 104 and 106 are laterally aligned along the vertical axis 120. The acoustic ports 104 and 106 are laterally aligned if, when viewed along the axis 120, the cross-section of the acoustic port 104 and the cross-section of the acoustic port 106 are aligned one on top of another such that the outer perimeter of the acoustic port 104 does not extend beyond the outer perimeter of the acoustic port 106, and vice versa. Such an alignment of the acoustic ports 104 and 106 is shown in FIG. 2A, which is a top view of the acoustic ports 104 and 106 with other elements of the acoustic input device removed.

In further examples, there can be some amount of deviation in the alignment between the acoustic ports 104 and 106 when viewed along the axis 120 that passes through the acoustic ports 104 and 106. Such a deviated arrangement of the acoustic ports 104 and 106 is shown in FIG. 2B, which is another top view of the acoustic ports 104 and 106 with other elements of the acoustic input device removed. The deviation in alignment between the acoustic ports 104 and 106 results in an offset between the acoustic ports 104 and 106 when viewed from the top. In some examples, the offset can be a deviation of 5% or less, a deviation of 10% or less, or a deviation of 20% or less. A deviation of X percentage in the alignment of the acoustic ports 104 and 106 when viewed along the axis 120 can refer to an outer perimeter of the acoustic port 104 extending beyond an outer perimeter of the acoustic port 106 by an amount that is X percentage of the width of the acoustic port 104 or 106.

The acoustic ports 104 and 106 are aligned with respect to each other along the axis 120 if the deviation between the acoustic ports 104 and 106 (represented by the offset shown in FIG. 2B) is less than a specified percentage of the width of the acoustic port 104 or 106.

Figure 2A:
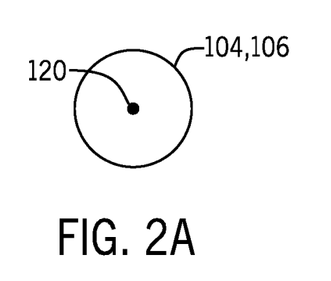
FIGS. 2A and 2B depict different relative offsets between acoustic ports of an acoustic input device according to some examples.
Figure 2B:
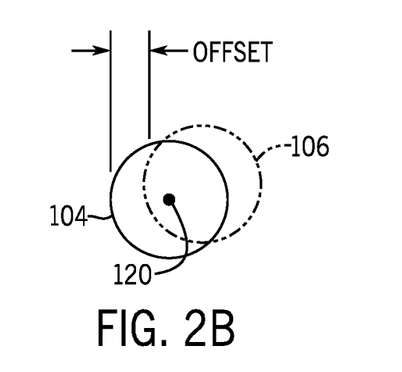

Although FIGS. 2A and 2B show the acoustic ports 104 and 106 as having circular cross-sectional profiles, it is noted that the acoustic ports 104 and 106 can have other cross-sectional profiles (e.g., rectangular, triangular, polygonal, etc.) in other examples.

Providing acoustic ports 104 and 106 that are aligned with respect to one another can be useful for various applications. For example, sound waves received through the acoustic ports 104 and 106 on opposite sides of the acoustic input device 100 can be used for noise reduction or noise cancellation. The acoustic input device 100 may be used to detect sound from an audio source, such as a human speaker or other audio source. There can be ambient noise from other audio sources in the environment, which can also be picked up by the acoustic input device 100 in addition to the sound from the audio source. For example, if the audio source is located near a location that faces the acoustic port 106, then sound detected by the acoustic transducer 110 can be considered as mostly useful audio and sound detected by the acoustic transducer 108 through the acoustic port 104 can be considered mostly noise that can be subtracted with a noise cancellation technique. This noise suppression is processed with the output 114 from the controller 112.

Another application of using acoustic ports that are aligned with respect to one another is beamforming, which processes outputs from multiple acoustic transducers (including the acoustic transducers 108 and 110) to increase sensitivity in a particular direction while at the same time rejecting sound from other directions. Beamforming can use the differences of sounds arriving from different directions to focus the sensitivity of the audio input device 100 in a particular direction.

In other examples, aligned ports 104 and 106 of the acoustic input device 100 can be useful for other purposes.

Figure 3:
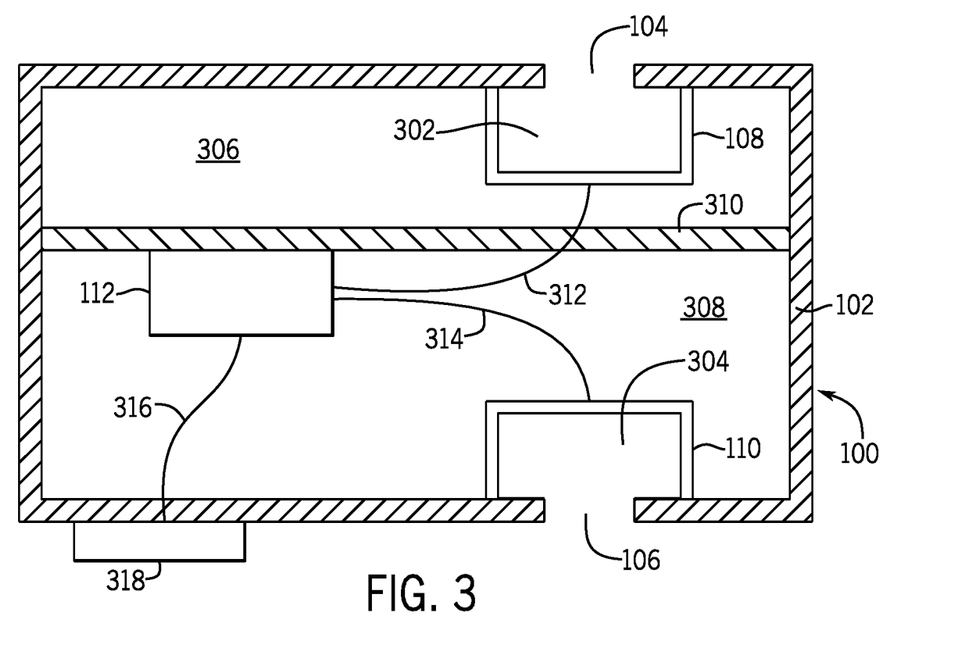
FIG. 3 is a sectional side view of an acoustic input device according to some examples.

FIG. 3 is a sectional view of the acoustic input device 100 according to further examples. In examples according to FIG. 3, the acoustic transducers 108 and 110 can include MEMS transducers. A front acoustic chamber 302 is provided between the MEMS sensor 108 and the acoustic port 104, and a front acoustic chamber 304 is provided between the MEMS sensor 110 and the acoustic port 106. The front acoustic chamber 302 is adjacent the acoustic port 104, and the front acoustic chamber 304 is adjacent the acoustic port 106. A back acoustic chamber 306 is provided on the back of the MEMS sensor 108, where the back acoustic chamber 306 is separated from the front chamber 302 by the MEMS sensor 108. Similarly, a back acoustic chamber 308 is provided at the back of the MEMS sensor 110, and the back acoustic chamber 308 is separated from the front acoustic chamber 304 by the MEMS sensor 110. In addition, a barrier 310 is provided inside the housing 102 of the acoustic input device 100 to isolate the back acoustic chamber 306 for the MEMS sensor 108 from the back acoustic chamber 308 for the MEMS sensor 110. These acoustic chambers should be constructed such that the two transducers 108 and 110 have similar sensitivity and frequency response. As an example, the two front chambers 302 and 304 should have similar size and shape, and the two back chambers 306 and 308 should have similar size and shape so that the two transducers 108 and 110 have a similar sensitivity and frequency response.

The housing 102 can be formed of a rigid material, such as metal, a plastic, or any other material. The barrier 310 can also be similarly formed of a rigid material, such as a metal, plastic, and so forth. The barrier 310 can be integrally formed with the housing 102, such that the barrier 310 and the housing 102 are fabricated as one piece.

The back chamber 306 or 308 allows the moveable membrane of the respective MEMS sensor 108 or 110 to move in response to sound waves received through the corresponding acoustic port 104 or 106 into the respective front chamber 302 or 304. The output of the MEMS sensor 108 is provided over an electrical wire 312 to the controller 112, and the output of the MEMS sensor 110 is provided over an electrical wire 314 to the controller 112. In examples according to FIG. 3, the controller 112 is mounted to a surface of the barrier 310. In the arrangement shown in FIG. 3, the electrical wire 312 can extend from the MEMS sensor 108 through the barrier 310 (such as through a via in the barrier 310) to the controller 112. In other examples, the controller 112 can be mounted on a different surface inside the housing 102.

Based on the outputs received from the MEMS sensors 108 and 110 over the wires 312 and 314, the controller 112 produces a corresponding output that is provided as a signal over an electrical wire 316 to an input/output (I/O) contact pad 318 that is mounted on an external surface of the housing 102 of the acoustic input device 100. The contact pad 318 can be electrically connected to another device. For example, the acoustic input device 100 can be surface mounted onto a printed circuit board, such that the contact pad 318 is electrically contacted to a corresponding pad on the printed circuit board. Alternatively, the contact pad 318 can be electrically connected to a wire that is attached to another external device.

Although not shown, there can be other electrical contact pads (in addition to the data contact pad 318) provided on the housing 102 of the acoustic input device 100. Such other contact pads are discussed further below.

As seen in FIGS. 1 and 3, the acoustic output device 100 has multiple acoustic ports and multiple respective acoustic transducers, where each acoustic transducer is a single-port acoustic transducer. A "single-port" acoustic transducer refers to an acoustic transducer that receives acoustic input through just one acoustic port (and not through multiple acoustic ports). Thus, as seen in FIG. 1 or 3, the acoustic transducer 108 receives acoustic waves through the acoustic port 104, but does not receive acoustic waves through the acoustic port 106. Similarly, the acoustic transducer 110 receives acoustic waves through the acoustic port 106, but does not receive acoustic waves through the acoustic port 104.

The multi-port, multi-transducer acoustic input device 100 according to some examples has the capacity of two separate, single-port acoustic input devices. However, the capacity of multiple single-port acoustic input devices is provided in a single package (within the housing 102) that includes the acoustic transducers 108 and 110 and the controller 112. Note that the acoustic input device 100 includes just one controller 112, instead of the multiple controllers that would be included in multiple separate acoustic input devices. As a result, the acoustic input device 100 has a smaller number of components, which would lead to a reduced size and reduced cost as compared to implementations where multiple separate acoustic input devices were used.

Figure 4:
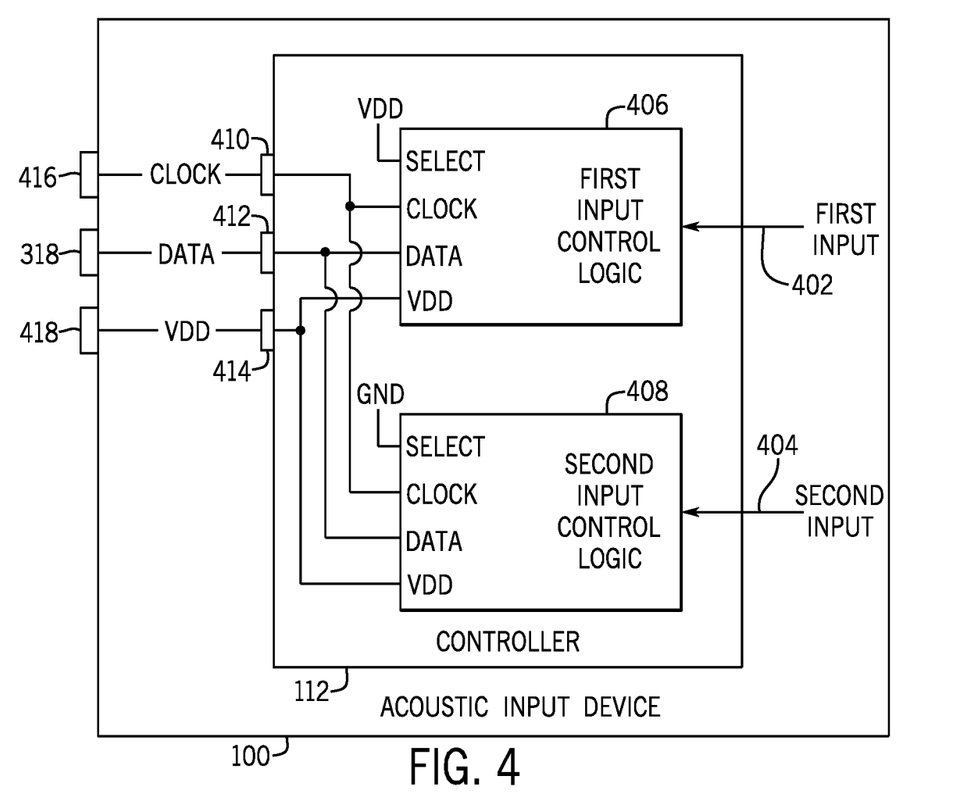
FIG. 4 is a schematic diagram of an acoustic input device including a controller according to some examples.

FIG. 4 is a schematic diagram of the controller 112 in the acoustic input device 100, according to some examples. The controller 112 receives a first input 402 from the acoustic transducer 108, and a second input 404 from an acoustic transducer 110. The controller 112 includes a first input control logic 406 to process the first input 402, and a second input control logic 408 to process the second input 404. As used here, "logic" in the controller 112 can refer to a respective portion of a hardware processing circuit of the controller 112, or alternatively, to respective machine-readable instructions (software or firmware) executable by the controller 112.

The first input control logic 406 and the second input control logic 408 share signal lines to various I/O pins 410, 412, and 414 of the controller 112. An I/O pin refers to an electrical connection point (which can be in the form of an electrically conductive pad or lead, for example) of the controller 112 that allows internal circuitry of the controller 112 to be connected to external signals. The signal pins 410, 412, and 414 include a clock pin 410 to receive a clock signal, a data pin 412 to provide a data output from the controller 112, and a VDD pin 414 to receive a power supply voltage (referred to as "VDD").

The clock signal received by the clock pin 410 is provided to clock inputs of the first and second input control logic 406 and 408, and the VDD input from the VDD pin 414 is provided to the VDD input of the first and second input control logic 406 and 408. Moreover, data from the first and second input control logic 406 and 408 can be provided to the data pin 412 to output as a data signal.

The controller 112 can selectively output data from the acoustic transducers 108 and 110 at different times, such that at a first time, the output of the acoustic transducer 108 (as received at the first input 402) is output by the first input control logic 406 on the data pin 412, and at a second, different time, the output of the acoustic transducer 110 (as received at the second input 404) is output by the second input control logic 408 to the data pin 412.

The selection of which of the first and second input control logic 406 and 408 is active is based on a select input of the first and second input control logic 406 and 408. The select input of the first input control logic 406 is tied to VDD, while the select input of the second input control logic 408 is tied to a ground reference (GND). More generally, the select input of the first input control logic 406 is connected to a first state, and the select input of the second input control logic 408 is connected to a second, different state. In response to the select input of the first input control logic 406 being tied to VDD, the first input control logic 406 provides a data output onto the data pin 412 on the rising edge of the clock signal. On the other hand, in response to the select input of the second input control logic 408 being tied to GND, the second input control logic 408 outputs data onto the data pin 412 on the falling edge of the clock signal. In this way, the multiple acoustic transducers 108 and 110 can share the same data pin 412, which is able to selectively output the outputs of the acoustic transducers 108 and 110 at different times.

The clock pin 410, the data pint 412, and the VDD pin 414 of the controller 112 are connected over respective electrical lines to I/O pads 416, 318, and 418 of the acoustic input device 100, which can be connected to a component external of the acoustic input device 100. The I/O pads 416, 318, and 418 can be arranged on outer surfaces of the housing of the acoustic input device 100. The I/O pad 416 is a clock contact pad, the I/O pad 318 is a data contact pad, and the I/O pad 418 is a VDD contact pad. Even though the acoustic input device 100 has the capacity of multiple single-port acoustic input devices, the acoustic input device 100 uses just one set of I/O pads 416, 318, and 418 that are shared by the first input and second input control logic 406 and 408 of the controller 112. In this manner, the number of I/O pads and the number of electrical lines between the I/O pads and the controller 112 are reduced, which can reduce the amount of space consumed by the I/O pads and electrical lines. Also, reducing the number of electrical lines (such as to communicate high-frequency signals such as the clock and data) can also lead to reduced interference due to high-frequency noise.

Figure 5:
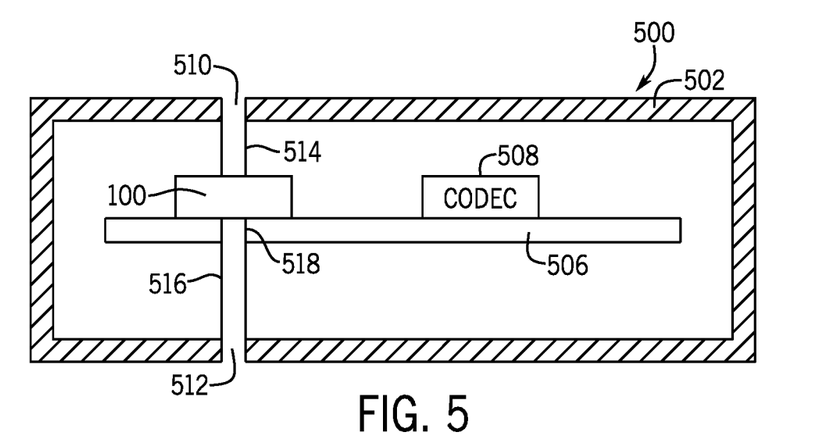
FIG. 5 is a sectional view of an electronic device according to further examples.

FIG. 5 is a sectional view of an electronic device 500, which includes an outer housing 502. A printed circuit board (PCB) or other type of substrate 506 is positioned inside the electronic device 500. The multi-port acoustic input device 100 is mounted on the substrate 506. The acoustic input device 100 is electrically connected to conductive traces on the substrate 506 which can be connected to an audio coder/decoder (codec) 508 or another processing device. The audio codec 508 can provide the clock signal to the acoustic input device 100, and can receive the data output from the acoustic input device 100. The audio codec 508 can apply coding to the output received from the audio input device 100. Although not shown, a further audio processing device can be provided on the substrate 506 to produce an audio output based on the output of the audio codec 508.

The housing 502 can be formed of a rigid material such as a metal, a polymer, a plastic, and so forth. The housing 502 can include an acoustic port 510 and an acoustic port 512 arranged on opposite surfaces of the housing 502 of the electronic device 500. The acoustic port 510 of the electronic device housing 502 is coupled over an acoustic path 514 to the acoustic port 104 of the acoustic input device 100, and the electronic device acoustic port 512 is coupled over an acoustic path 516 through the substrate 506 to the acoustic port 106 of the acoustic input device 100.

As shown in FIG. 5, an opening 518 is formed in the substrate 506 to allow the acoustic path 516 to pass from the bottom side of the substrate 506 through the substrate 506 to the topside of the substrate 506, such that acoustic waves received through the electronic device acoustic port 512 can be passed to the acoustic port 106 of the acoustic input device 100. The opening 518 is located adjacent the acoustic port 106 of the acoustic input device 100.

Figure 6:
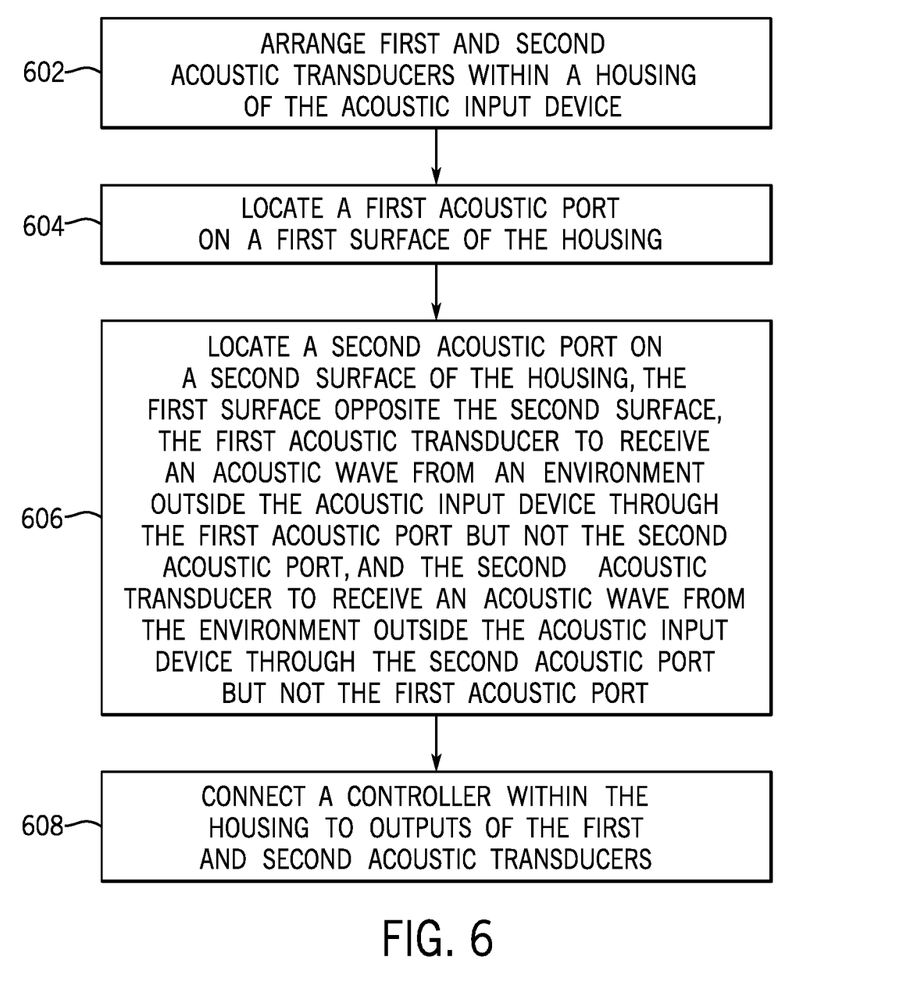
FIG. 6 is a flow diagram of a process of providing an acoustic input device according to some examples.

FIG. 6 is a flow diagram of a process of providing (making, assembling, etc.) an acoustic input device, such as the acoustic input device 100 of FIG. 1. The process of FIG. 6 arranges (at 602) first and second acoustic transducers within a housing of the acoustic input device. The process further includes providing (at 604) a first acoustic port on a first surface of the housing, and providing (at 606) a second acoustic port on a second surface of the housing, where the first surface is opposite the second surface, and the first acoustic transducer is to receive an acoustic wave from an environment outside the acoustic input device through the first acoustic port but not the second acoustic port, and the second acoustic transducer is to receive an acoustic wave from the environment outside the acoustic input device through the second acoustic port but not the first acoustic port.

The process of FIG. 6 further includes connecting (at 608) a controller within the housing to outputs of the first and second acoustic transducers.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. An acoustic input device comprising:
   a housing comprising a plurality of acoustic ports;
   first and second single-port acoustic transducers within the housing to receive respective acoustic waves from an environment outside the acoustic input device through corresponding acoustic ports of the plurality of acoustic ports, wherein a first acoustic port of the plurality of acoustic ports is located on a first surface of the housing, and a second acoustic port of the plurality of acoustic ports is located on a second surface of the housing that is opposite the first surface, and wherein the first single-port acoustic transducer is mounted to the first surface, and the second single-port acoustic transducer is mounted to the second surface;
   a barrier between the first and second single-port acoustic transducers to isolate a first back acoustic chamber adjacent the first single-port acoustic transducer from a second back acoustic chamber adjacent the second single-port acoustic transducer, wherein the first single-port acoustic transducer is between the first acoustic port and the first back acoustic chamber, and the second single-port acoustic transducer is between the second acoustic port and the second back acoustic chamber; and
   a controller within the housing and mounted on the barrier to receive outputs of the first and second single-port acoustic transducers.

2. The acoustic input device of claim 1, wherein the first acoustic port is laterally aligned with the second acoustic port along an axis that passes through the first and second acoustic ports.

3. The acoustic input device of claim 2, wherein, when viewed along the axis, a cross-section of the first acoustic port and a cross-section of the second acoustic port are aligned one over another such that an outer perimeter of the first acoustic port does not extend beyond an outer perimeter of the second acoustic port.

4. The acoustic input device of claim 1, further comprising:
   a first electrical wire extending from the first single-port acoustic transducer to the controller; and
   a second electrical wire extending from the second single-port acoustic transducer through a via in the barrier to the controller.

5. The acoustic input device of claim 1, wherein the first single-port acoustic transducer has a first front acoustic chamber adjacent the first acoustic port, and the second single-port acoustic transducer has a second front acoustic chamber adjacent the second acoustic port.

6. The acoustic input device of claim 1, wherein the controller has a data output to provide an audio output from a selected one of the first and second acoustic transducers.

7. The acoustic input device of claim 6, wherein the controller is to automatically select between the outputs of the first and second single-port acoustic transducers at respective different times.

8. The acoustic input device of claim 7, wherein the controller is to select the output of the first single-port acoustic transducer on a rising edge of a clock, and to select the output of the second single-port acoustic transducer on a falling edge of the clock.

9. The acoustic input device of claim 1, further comprising a data contact pad and a clock contact pad, the controller to output audio signals corresponding to the outputs of the first and second single-port acoustic transducers at the data contact pad, and to control processing of the outputs of the first and second single-port acoustic transducers using a clock signal received at the clock contact pad.

10. The acoustic input device of claim 1, wherein the controller is to digitize the outputs of the first and second single-port acoustic transducers.

11. The acoustic input device of claim 5, wherein the first single-port acoustic transducer has a moveable membrane to move in response to a first sound wave passed through the first acoustic port into the first front acoustic chamber, and the second single-port acoustic transducer has a moveable membrane to move in response to a second sound wave passed through the second acoustic port into the second front acoustic chamber.

12. The acoustic input device of claim 11, wherein the first front acoustic chamber is on one side of the first single-port acoustic transducer, and the first back acoustic chamber is on an opposite side of the first single-port acoustic transducer, and wherein the second front acoustic chamber is on one side of the second single-port acoustic transducer, and the second back acoustic chamber is on an opposite side of the second single-port acoustic transducer.

13. The acoustic input device of claim 12, wherein the first single-port acoustic transducer does not receive the second sound wave passed through the second acoustic port, and the second single-port acoustic transducer does not receive the first sound wave passed through the first acoustic port.

14. An electronic device comprising:
    a substrate;
    an acoustic input device on the substrate and comprising:
        a housing comprising a first acoustic port and a second acoustic port, wherein the first acoustic port is laterally aligned with the second acoustic port along an axis that passes through the first and second acoustic ports, wherein the first acoustic port is located on a first surface of the housing, and the second acoustic port is located on a second surface of the housing that is opposite the first surface;
        a first acoustic transducer within the housing to receive an acoustic wave through the first acoustic port but not the second acoustic port, wherein the first acoustic transducer is mounted to the first surface;
        a second acoustic transducer within the housing to receive an acoustic wave through the second acoustic port but not the first acoustic port, wherein the second acoustic transducer is mounted to the second surface; and
        a barrier between the first and second acoustic transducers to isolate a first back acoustic chamber adjacent the first acoustic transducer from a second back acoustic chamber adjacent the second acoustic transducer, wherein the first acoustic transducer is between the first acoustic port and the first back acoustic chamber, and the second acoustic transducer is between the second acoustic port and the second back acoustic chamber; and
        a controller within the housing and mounted on the barrier to receive outputs of the first and second acoustic transducers; and
    another device on the substrate to receive an output of the acoustic input device.

15. The electronic device of claim 14, further comprising an opening in the substrate, the opening in the substrate being adjacent the second acoustic port to allow an acoustic wave to travel through the opening in the substrate to the second acoustic port.

16. The electronic device of claim 15, further comprising an outer housing in which the substrate and the acoustic input device are located, the outer housing comprising a first opening through which an acoustic wave is to travel to the first acoustic port of the acoustic input device, and a second opening through which an acoustic wave is to travel to the second acoustic port of the acoustic input device.

17. The electronic device of claim 14, wherein, when viewed along the axis, a cross-section of the first acoustic port and a cross-section of the second acoustic port are aligned one over another such that an outer perimeter of the first acoustic port does not extend beyond an outer perimeter of the second acoustic port, and the outer perimeter of the second acoustic port does not extend beyond the outer perimeter of the first acoustic port.

18. The electronic device of claim 14, wherein the first acoustic transducer has a first front acoustic chamber adjacent the first acoustic port, and the second acoustic transducer has a second front acoustic chamber adjacent the second acoustic port, and wherein the first acoustic transducer has a moveable membrane to move in response to a sound wave passed through the first acoustic port into the first front acoustic chamber, and the second acoustic transducer has a moveable membrane to move in response to a sound wave passed through the second acoustic port into the second front acoustic chamber.

19. A method of providing an acoustic input device, comprising:
    arranging first and second acoustic transducers within a housing of the acoustic input device;
    locating a first acoustic port on a first surface of the housing, and locating a second acoustic port on a second surface of the housing, the first surface opposite the second surface, the first acoustic transducer to receive an acoustic wave from an environment outside the acoustic input device through the first acoustic port but not the second acoustic port, and the second acoustic transducer to receive an acoustic wave from the environment outside the acoustic input device through the second acoustic port but not the first acoustic port, wherein the first acoustic transducer is mounted to the first surface, and the second acoustic transducer is mounted to the second surface;
    arranging a barrier between the first and second acoustic transducers to isolate a first back acoustic chamber adjacent the first acoustic transducer from a second back acoustic chamber adjacent the second acoustic transducer, wherein the first acoustic transducer is between the first acoustic port and the first back acoustic chamber, and the second acoustic transducer is between the second acoustic port and the second back acoustic chamber; and
    connecting a controller within the housing and mounted to the barrier to outputs of the first and second acoustic transducers.

20. The method of claim 19, further comprising:

arranging a data contact pad on the housing, the data contact pad connected to the controller, and the controller to provide audio signals, at the data contact pad, corresponding to the outputs of the first and second acoustic transducers.

\* \* \* \* \*